US012796326B1

(12) United States Patent
Fonash

(10) Patent No.: US 12,796,326 B1
(45) Date of Patent: Nov. 10, 2026

(54) HETEROJUNCTION ARCHITECHTURE FOR INCREASING THE PERFORMANCE OF THERMORADIATIVE ELECTRIC POWER PRODUCING DEVICES

(71) Applicant: Stephen J. Fonash, State College, PA (US)

(72) Inventor: Stephen J. Fonash, State College, PA (US)

( * ) Notice: Subject to any disclaimer, the term of this patent is extended or adjusted under 35 U.S.C. 154(b) by 0 days.

(21) Appl. No.: 19/289,266

(22) Filed: Aug. 4, 2025

(51) Int. Cl.

| | |
|---|---|
| ***H10N 10/17*** | (2023.01) |
| ***H10N 10/00*** | (2023.01) |
| ***H10N 10/10*** | (2023.01) |
| ***H10N 10/81*** | (2023.01) |
| *H10N 10/01* | (2023.01) |
| *H10N 10/85* | (2023.01) |

(52) U.S. Cl.
CPC ............ *H10N 10/17* (2023.02); *H10N 10/00* (2023.02); *H10N 10/81* (2023.02); *H10N 10/01* (2023.02); *H10N 10/10* (2023.02); *H10N 10/85* (2023.02)

(58) Field of Classification Search
CPC ...... H10F 30/222; H10F 10/16; H10F 10/163; H10H 20/811; H10H 20/812; H10H 20/816; H10H 20/8215; Y02E 10/544; H10N 10/17; H10N 10/00; H10N 10/81; H10N 10/01; H10N 10/10; H10N 10/85; H10N 10/8556
See application file for complete search history.

(56) References Cited

U.S. PATENT DOCUMENTS 3,199,302 A * 8/1965 Rollinger ................ F25B 21/02 310/306
3,262,059 A * 7/1966 Gunn ........................ H01S 5/30 5/414
3,537,029 A * 10/1970 Kressel .................. H10H 20/80 148/DIG. 32
3,758,875 A * 9/1973 Hayashi .................. H01S 5/183 148/DIG. 72
3,812,516 A * 5/1974 Hayashi .................... H01S 5/32 257/E33.049

(Continued)

FOREIGN PATENT DOCUMENTS

KR 20230108273 A * 7/2023 ........... H10N 10/855

*Primary Examiner* — Maliheh Malek
(74) *Attorney, Agent, or Firm* — MaxGoLaw PLLC

(57) ABSTRACT

A semiconductor heterojunction thermoradiative electric power generator including at least three semiconductors each with a different type of doping and each with a different degree of doping. Additionally, two of said at least three semiconductors have a different band edge value with position and a different Seebeck coefficient. The at least three semiconductors include two materials having advantageous Seebeck coefficient values and having some reduction of resistance loss. The heterojunction architecture of the semiconductor heterojunction thermoradiative electric power generator significantly improving the performance of thermoradiative electric power producing devices. The performance enhancement arising from the design's exploitation of thermoelectric phenomena. As a result, increased performance capabilities and flexibility in material parameter selection can be achieved through optimization of band edge and Seebeck coefficient values.

7 Claims, 3 Drawing Sheets

(56) References Cited

U.S. PATENT DOCUMENTS

| | | | | |
|---|---|---|---|---|
| 3,965,347 | A * | 6/1976 | Heywang | H10H 20/80<br>257/86 |
| 4,905,059 | A * | 2/1990 | Shur | H01S 5/0422<br>257/E33.049 |
| 5,147,826 | A * | 9/1992 | Liu | H10P 14/22<br>117/930 |
| 5,409,547 | A * | 4/1995 | Watanabe | H10N 10/855<br>136/224 |
| 5,454,002 | A * | 9/1995 | McCann | H01S 5/02415<br>372/36 |
| 5,799,026 | A * | 8/1998 | Meyer | B82Y 20/00<br>257/97 |
| 5,808,350 | A * | 9/1998 | Jack | G01J 5/10<br>257/E27.138 |
| 6,100,103 | A * | 8/2000 | Shim | H10H 29/10<br>438/455 |
| 6,396,191 | B1 * | 5/2002 | Hagelstein | H01J 45/00<br>310/306 |
| 6,850,013 | B1 * | 2/2005 | Ashley | G01N 21/3504<br>257/E31.113 |
| 7,109,408 | B2 * | 9/2006 | Kucherov | H02N 11/002<br>136/211 |
| 7,459,730 | B1 * | 12/2008 | Kinch | H10F 30/222<br>257/191 |
| 7,566,897 | B2 * | 7/2009 | Bibilashvili | B82Y 10/00<br>257/24 |
| 8,569,834 | B2 * | 10/2013 | Fonash | B82Y 10/00<br>257/288 |
| 9,209,246 | B2 * | 12/2015 | Fonash | B82Y 10/00 |
| 9,557,215 | B2 * | 1/2017 | Santhanam | F21K 9/20 |
| 9,954,154 | B2 * | 4/2018 | Kryskowski | H10N 10/80 |
| 10,205,046 | B2 * | 2/2019 | Santhanam | G01J 3/108 |
| 10,439,119 | B2 * | 10/2019 | Kryskowski | H10N 10/17 |
| 10,483,450 | B1 * | 11/2019 | Wabiszewski | H10N 10/01 |
| 10,777,727 | B2 * | 9/2020 | Imry | F25B 21/04 |
| 10,824,049 | B1 * | 11/2020 | Yap | H01S 3/108 |
| 11,430,905 | B1 * | 8/2022 | Kaliski | H10D 30/015 |
| 11,496,072 | B2 * | 11/2022 | Wu | H01J 45/00 |
| 11,696,502 | B2 * | 7/2023 | Gidwani | H10D 62/80<br>438/54 |
| 11,715,809 | B2 * | 8/2023 | Santhanam | H10F 10/16<br>257/12 |
| 2004/0253759 | A1 * | 12/2004 | Garber | B82Y 20/00<br>438/46 |
| 2005/0155642 | A1 * | 7/2005 | Chen | H10N 10/00<br>136/260 |
| 2005/0247337 | A1 * | 11/2005 | Chen | H10N 10/00<br>136/211 |
| 2006/0131579 | A1 * | 6/2006 | Rothman | H10F 30/21<br>257/85 |
| 2006/0225773 | A1 * | 10/2006 | Venkatasubramanian | B82Y 10/00<br>136/205 |
| 2007/0289315 | A1 * | 12/2007 | Larsson | F25B 21/00<br>62/3.3 |
| 2008/0013881 | A1 * | 1/2008 | Welch | G02B 6/12004<br>385/14 |
| 2008/0251862 | A1 * | 10/2008 | Fonash | B82Y 10/00<br>257/E21.409 |
| 2009/0190312 | A1 * | 7/2009 | Katayama | H10P 34/42<br>361/708 |
| 2010/0102298 | A1 * | 4/2010 | Wu | H10D 10/00<br>257/E29.078 |
| 2010/0326486 | A1 * | 12/2010 | Beck | H10N 10/17<br>136/203 |
| 2011/0232734 | A1 * | 9/2011 | Kumar | H02S 10/30<br>136/255 |
| 2011/0291103 | A1 * | 12/2011 | Mazzillo | H10F 30/227<br>438/94 |
| 2011/0313748 | A1 * | 12/2011 | Li | G06F 30/30<br>703/14 |
| 2013/0009262 | A1 * | 1/2013 | Dowben | H10F 30/222<br>257/E31.028 |
| 2013/0192663 | A1 * | 8/2013 | Fonash | H10F 10/17<br>136/246 |
| 2013/0285149 | A1 * | 10/2013 | Fonash | B82Y 10/00<br>257/288 |
| 2014/0319532 | A1 * | 10/2014 | Werner | H10D 30/015<br>438/191 |
| 2014/0319638 | A1 * | 10/2014 | Chia | H10F 30/225<br>257/438 |
| 2014/0326286 | A1 * | 11/2014 | Imry | F25B 21/04<br>136/203 |
| 2014/0369386 | A1 * | 12/2014 | Radhakrishnan | G01F 1/6845<br>29/25.01 |
| 2015/0068576 | A1 * | 3/2015 | Kryskowski | H10N 10/17<br>136/212 |
| 2016/0126381 | A1 * | 5/2016 | Wang | G02B 6/122 |
| 2016/0139040 | A1 * | 5/2016 | Case | G01N 21/3577<br>356/440 |
| 2016/0245742 | A1 * | 8/2016 | Case | G01N 21/3577 |
| 2016/0276563 | A1 * | 9/2016 | Kryskowski | H10N 10/17 |
| 2016/0298882 | A1 * | 10/2016 | Chen | H10N 10/17 |
| 2017/0077675 | A1 * | 3/2017 | Noda | H01S 5/11 |
| 2018/0287548 | A1 * | 10/2018 | Wang | H02S 10/30 |
| 2019/0044470 | A1 * | 2/2019 | Schubert | B64D 41/00 |
| 2019/0206758 | A1 * | 7/2019 | Lin | H10H 20/81 |
| 2019/0296131 | A1 * | 9/2019 | Kim | H01S 5/0218 |
| 2019/0385839 | A1 * | 12/2019 | Kim | B82Y 10/00 |
| 2020/0035894 | A1 * | 1/2020 | Kryskowski | H10N 10/851 |
| 2020/0119249 | A1 * | 4/2020 | Schwede | H01J 45/00 |
| 2021/0050468 | A1 * | 2/2021 | Shi | H10F 10/16 |
| 2021/0140069 | A1 * | 5/2021 | Shrekenhamer | C30B 23/025 |
| 2021/0143289 | A1 * | 5/2021 | Zhang | H10F 30/222 |
| 2021/0234028 | A1 * | 7/2021 | Detzel | H10D 30/015 |
| 2021/0280760 | A1 * | 9/2021 | Chanda | G01J 5/03 |
| 2021/0296521 | A1 * | 9/2021 | Pradhan | H02S 10/10 |
| 2021/0305447 | A1 * | 9/2021 | Fonash | H10F 77/484 |
| 2021/0408318 | A1 * | 12/2021 | Santhanam | H10F 10/16 |
| 2022/0029081 | A1 * | 1/2022 | Khvorostianyi | H10N 10/17 |
| 2022/0037408 | A1 * | 2/2022 | Azoulay | H10K 30/20 |
| 2022/0174228 | A1 * | 6/2022 | Carr | G01J 5/023 |
| 2023/0060671 | A1 * | 3/2023 | Hsu | H10N 19/00 |
| 2023/0238328 | A1 * | 7/2023 | Alberi | H10D 62/8603<br>257/613 |
| 2023/0266291 | A1 * | 8/2023 | Myrick | G01N 21/3504 |
| 2024/0040923 | A1 * | 2/2024 | Chen | H10K 30/10 |
| 2025/0107118 | A1 * | 3/2025 | Atanackovic | H10D 8/60 |
| 2025/0107122 | A1 * | 3/2025 | Atanackovic | H10D 8/60 |
| 2025/0107193 | A1 * | 3/2025 | Atanackovic | H10D 12/031 |
| 2025/0107443 | A1 * | 3/2025 | Bhatia | H10N 10/13 |
| 2025/0194189 | A1 * | 6/2025 | Agrawal | H10D 30/831 |

* cited by examiner

HETEROJUNCTION ARCHITECHTURE FOR INCREASING THE PERFORMANCE OF THERMORADIATIVE ELECTRIC POWER PRODUCING DEVICES

FIELD OF THE INVENTION

The present invention relates in general to thermoradiative electric power producing devices and in particular to a heterojunction architecture which can significantly improve the performance of thermoradiative electric power producing devices. The performance enhancement arises from the design's exploitation of thermoelectric phenomena.

BACKGROUND OF THE INVENTION

Thermoradiative Electric Power Producing Devices have been the subject of recent design and analysis activity. The devices are of considerable interest due to their ability to convert heat into electrical energy and to do so at night.

Thermoradiative power producing devices convert heat into electrical current-voltage energy. To date, the focus has been on thermoradiative device architecture based on semiconductor homojunction configurations. Semiconductor structures for thermoradiative power production are often considered the opposite of photovoltaic devices. The distinction occurs since thermoradiative devices have electrical power production arising from radiating away photons to disperse light energy. Photovoltaic devices are based on capturing photons to gain light energy and convert it into electrical energy.

Previously, thermoradiative power conversion device architectures have focused on semiconductor homojunction architectures. However, such homojunction architectures fail to exploit thermoelectric effects resulting in reduced performance capabilities and reduced flexibility in material parameter selection, thereby limiting the range of semiconductor materials.

Thus, there exists a need for a thermoradiative power conversion device with a heterojunction architecture to open thermoradiative devices up to desirable access to today's range of semiconductor materials and interface engineering techniques and significantly improve the performance of thermoradiative electric power producing devices. Such thermoradiative power conversion devices with a heterojunction architecture exploit thermoelectric effects that are typically totally ignored and difficult to exploit in the homojunction design.

SUMMARY OF THE INVENTION

The present invention provides a semiconductor heterojunction thermoradiative electric power generator that includes at least three semiconductors each with a different type of doping and each with a different degree of doping. Additionally, each of said at least three semiconductors has a different band gap value and a different Seebeck coefficient. According to embodiments, the at least three semiconductors are formed of materials having advantageous Seebeck coefficient values and/or having a reduction of resistance loss. The unique heterojunction architecture of the semiconductor heterojunction thermoradiative electric power generator significantly improves the performance of thermoradiative electric power producing devices. The performance enhancement arises from the design's exploitation of thermoelectric phenomena. As a result, the embodiments of the present invention provide increased performance capabilities and flexibility in material parameter selection allowing optimization of band edge and Seebeck coefficient values.

BRIEF DESCRIPTION OF THE DRAWINGS

The present invention is further detailed with respect to the following drawings. These drawings are not intended to limit the scope of the appended claims, but rather to illustrate specific embodiments thereof.

DESCRIPTION OF THE PREFERRED EMBODIMENTS

Figure 1:
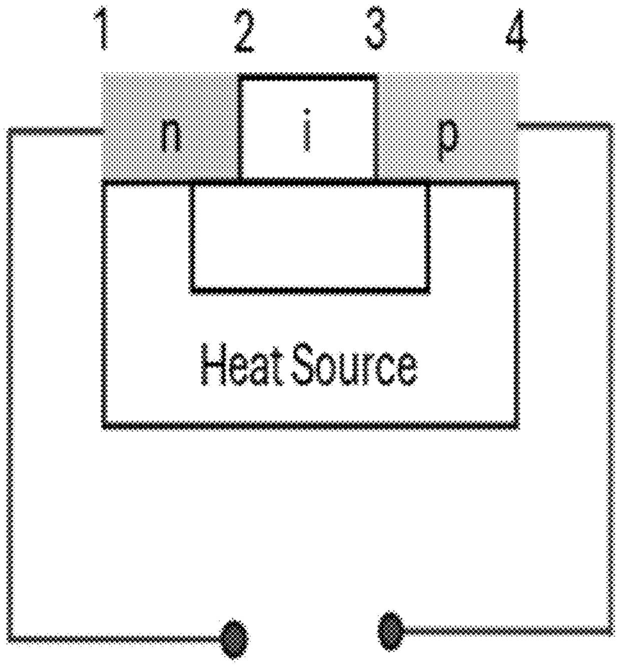
FIG. 1 shows a depiction of the physical appearance of an n/p homojunction or heterojunction thermoradiative power generator where the n-regions are doped with donor-type defects, the p-regions are doped with acceptor-type defects, and the I region is undoped.

Embodiments of the present invention have utility as a thermoradiative power conversion device with a heterojunction architecture, increasing access to today's range of semiconductor materials and interface engineering techniques and significantly improving the performance of thermoradiative electric power producing devices. Such thermoradiative power conversion devices with a heterojunction architecture exploit thermoelectric effects that are typically totally ignored and difficult to exploit in the homojunction design.

The present invention will now be described with reference to the following embodiments. As is apparent by these descriptions, this invention can be embodied in different forms and should not be construed as limited to the embodiments set forth herein. Rather, these embodiments are provided so that this disclosure will be thorough and complete, and will fully convey the scope of the invention to those skilled in the art. For example, features illustrated with respect to one embodiment can be incorporated into other embodiments, and features illustrated with respect to a particular embodiment may be deleted from the embodiment. In addition, numerous variations and additions to the embodiments suggested herein will be apparent to those skilled in the art in light of the instant disclosure, which do not depart from the instant invention. Hence, the following specification is intended to illustrate some particular embodiments of the invention, and not to exhaustively specify all permutations, combinations, and variations thereof.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

Unless otherwise defined, all technical and scientific terms used herein have the same meaning as commonly understood by one of ordinary skill in the art to which this invention belongs. The terminology used in the description of the invention herein is for the purpose of describing particular embodiments only and is not intended to be limiting of the invention.

Unless indicated otherwise, explicitly or by context, the following terms are used herein as set forth below.

As used in the description of the invention and the appended claims, the singular forms "a," "an" and "the" are intended to include the plural forms as well, unless the context clearly indicates otherwise.

Also as used herein, "and/or" refers to and encompasses any and all possible combinations of one or more of the associated listed items, as well as the lack of combinations when interpreted in the alternative ("or").

Examinations of device operation of semiconductor thermoradiative power producing configurations have focused on homojunction architectures and have ascertained that the driving mechanism for their power conversion capabilities is low temperature photon radiation loss [1-5]. Embodiments of the present invention provide heterojunction thermoradiative power producing structures which according to embodiments of the present invention are superior to the homojunction approach because this architecture opens the door to adding thermoelectric effects to device performance.

Figure 3A:
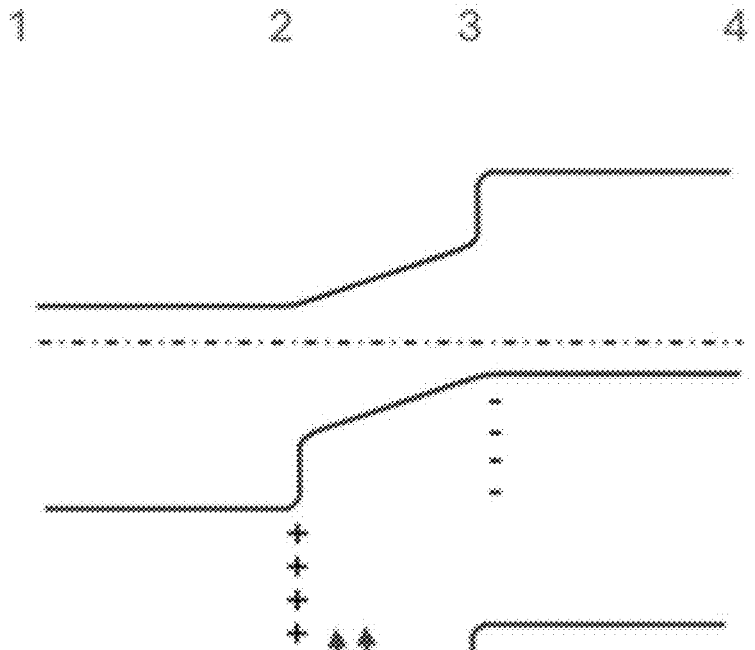
FIG. 3A shows the semiconductor band diagram for a heterojunction thermoradiative device in thermodynamic equilibrium.
Figure 3B:
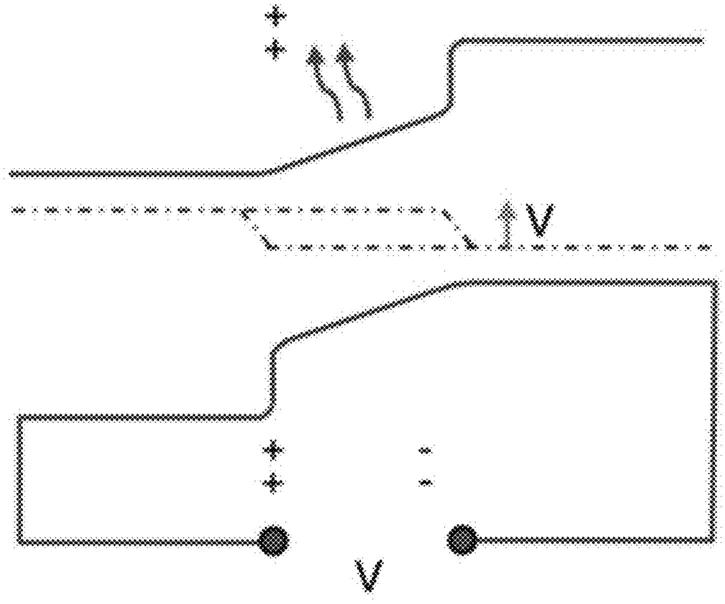
FIG. 3B shows the band diagram for the device when in the power producing mode.

The paths followed in operation by electrons and holes from the high temperature $T_H$ regions to their mutual annihilation in the cold temperature $T_C$ recombination region $L_{32}$ can be seen in FIG. 1, and in FIG. 3B. The role of the flow in energy-conversion operation is to convert heat energy at positions 1 and 4 with $T=T_H$ into electrical energy by inducing flow to the recombination region whose temperature is maintained at some $T_{EM} \geq T_C$. This temperature is maintained by radiating away at temperature $T_{EM} > T_C$ the photons produced by the recombination in $L_{32}$ [1-5].

Thermoradiative power producing devices have drawn recent interest. To date, the architecture that has been proposed and analyzed has been based on a semiconductor homojunction configuration. Embodiments of the present invention utilize semiconductor heterojunction structures. Such devices allow an analysis that clearly defines device regions, their roles, and consequently clearly exposes the more subtle components of semiconductor thermoradiative electric power generation. As a result, it is demonstrated for the first time that the heterojunction thermoradiative power producing architecture can significantly enhance electric power conversion efficiency due to the presence of the thermoelectric Thompson voltage effect.

These structures are subject to a full analysis made possible with a heterojunction structure having step-function defined material property regions. This architecture brings into focus and quantifies the advantages of heterojunction-based designs over homojunction devices. It points out the increased performance capabilities possible as well as the flexibility in material parameter selection allowing optimization of band edge and Seebeck coefficient values.

In the band diagram of a heterojunction thermoradiative device in operation in FIG. 3(B), electrons are flowing from the heat storage material at temperature $T_H$ through the n-material to the recombination layer $L_{32}$. In steady state, the same number of holes is flowing through the p-material to the recombination layer. The electron-hole recombination in this layer is producing photons which are designed to radiate out of the $L_{32}$ layer to maintain its $T_C$ temperature. This flow of electrons and holes into the recombination layer forces the electric field across that layer to be reduced as seen by the changes in the charge layers from FIG. 3A to FIG. 3B. Importantly, the flow forces the Fermi level at the left contact to rise above that at the right contact by V (volts) as seen in the FIG. 3B band diagram.

The total current density J and the voltage V produced by the operating heterojunction thermoradiative device of FIG. 3B can be mathematically modeled by starting with standard transport expressions for the current densities (A/cm$^2$) carried by electrons $J_n$ and by holes $J_P$ [6], as shown in Equation 1 and Equation 2.

$$J_n = e\mu_n n dE_{Fn}/dx - en\mu_n S_n dT_n/dx \qquad \text{Equation 1}$$

$$J_p = e\mu_p p\frac{dE_{FP}}{dx} - ep\mu_p S_p \frac{dT_p}{dx} \qquad \text{Equation 2}$$

Here the $E_{Fn}(x)$ and $E_{Fp}(x)$ are the carrier quasi-Fermi levels and $T_n$ and $T_p$ are the carrier temperatures which subsequently will be taken as both being T(x). The material parameters $\mu_n$ and up are the carrier mobilities while $S_n$ and $S_p$ are the electron (inherently negative) and hole (inherently positive) Seebeck coefficients [6].

Using the positional notation of FIG. 1 and integrating Equation 1 and Equation 2 over x gives Equations 3 and Equation 4.

$$J_n = \frac{e\mu_n n}{L}[E_{Fn}(2) - E_{Fn}(1)] - \frac{en\mu_n S_n}{L}[T(2) - T(1)] \qquad \text{Equation 3}$$

$$J_p = \frac{e\mu_p p}{L}[E_{Fp}(4) - E_{Fp}(3)] - \frac{ep\mu_p S_p}{L}[T(4) - T(3)] \qquad \text{Equation 4}$$

Figure 2:
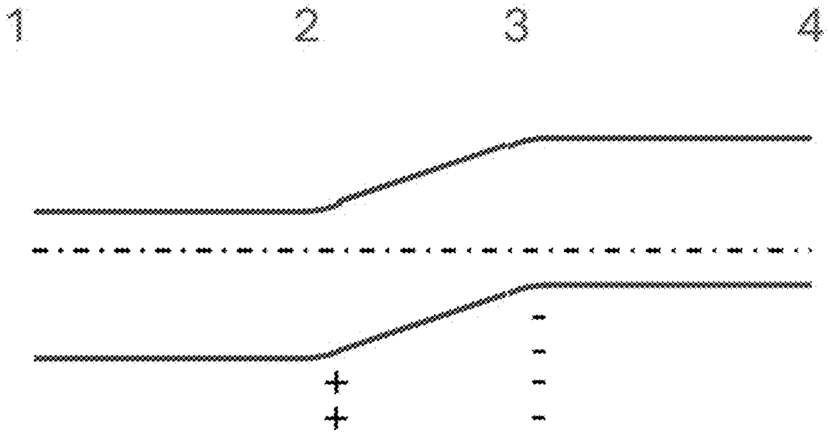
FIG. 2 shows a semiconductor band diagram for a homojunction thermoradiative device in thermodynamic equilibrium.

The former occurrence of L above is $L_{21}$ while the latter occurrence of L is $L_{43}$ These expressions take advantage of the step function band edges in the heterostructure of FIG. 2 which are designed to ensure negligible radiative, Auger, and Shockley-Read-Hall recombination in the n and p materials. The result of this band structure is that $J_n$ is constant in $L_{21}$, $J_p$ is constant in $L_{43}$, and since the generator is in steady state, $J=J_n=J_p=X$. Here, X is the total recombination per cross sectional area in the low temperature $L_{32}$ region due to the arriving electrons and holes annihilating each other. This recombination in $L_{32}$ is radiative and a positive quantity given by Equation 5

$$X = eg_{th}^R L_{32}\exp\left[\frac{(E_{Fn}(2) - E_{Fp}(3))}{kTc}\right] \qquad \text{Equation 3}$$

where $$g_{th}^R(T)$$

is the thermal generation rate [6]. In steady state, a supply of carriers is constantly needed to arrive at the low temperature region to support X. Photons produced by this recombination are assumed to be constantly radiated away at the temperature $T_{EM}$. This radiative recombination and the resulting radiation emission process result in carrier populations in $L_{32}$ that are below those of thermodynamic equilibrium for $T_C$. As a consequence, $E_{Fn}(2)-E_{Fp}(3)=V'$ where V' is a positive quantity as may be noted from FIG. 3B [6].

Overall, the voltage V developed between the device contacts is seen from FIG. 3B to add up as shown in Equation 6.

$$V = E_{Fn}(2) - E_{Fn}(1) + V' + E_{Fp}(4) - E_{Fp}(3) \quad \text{Equation 6}$$

Substituting the expressions found in Equation 3 and 4 for the quasi-Fermi level differences in Equation 6 results in Equation 7.

$$V = -\frac{L_{21}}{e\mu_{nn}}X - \frac{L_{43}}{e\mu_{pp}}X + (S_p - S_n)(T_H - T_{C^-}) + V' \quad \text{Equation 7}$$

The first two negative terms on the right hand side are JV resistive loss, the third is the thermoelectrically generated Thompson voltage contribution, and the fourth is the $L_{32}$ generated voltage contribution due to radiative recombination and photon loss. Equation 7 shows thermoelectric effects play a role in heterojunction thermoradiative power generators.

EXAMPLES (1) The band diagrams of FIGS. 3A and 3B show the heterostructure thermoradiative generator concept in thermodynamic equilibrium in FIG. 3A and in the energy production mode in FIG. 3B. As seen in these figures, this specifically shown implementation of the heterojunction concept has the properties of the three semiconductors involved varying abruptly at region boundaries with step function behavior. While step-functions are shown, the actual distance over which the semiconductor properties may change is in the nanoscale range Δ with Δ approximately ≤10 nm.

There are a multitude of semiconductors that can be used in the depiction presented in FIGS. 3A and 3B, especially when interface engineering concepts are used to create the boundaries [6].

To show the impact of the heterojunction device concept on Equation 7, the materials used in FIGS. 3A and 3B are not optimized but rather are simply taken to be those commonly found for silicon. Using silicon values of $S_p$=300μ V/K, $S_n$=−200μ V/K, and Eg=1.1 eV (for the band gap in the recombination layer) as example, material values allows an estimation of the relative importance of the terms assuming a 500K temperature difference. The result is that the thermoelectrical voltage contribution in Equation 7 is of the order of 0.25 V and the thermoradiative voltage contribution is of the order of 1.0 V noting $E_g$>V'. Importantly, in the case of the heterojunction design architecture of the present invention example, the presence of the thermoelectric effect can be seen to substantially improve the overall performance of a thermoradiative power generating device. Since the heterojunction design of FIGS. 3A and 3B can be used to ensure negligible JV resistive loss in the n and p regions, the power generated per cross-section can be expressed as Equation 8.

$$XV = X(S_p - S_n)(T_H - T_{C^-}) + XV' \quad \text{Equation 8}$$

Consequently, for the heterojunction thermoradiative architecture and material parameters of this example, the device performance is shown to be capable of being 25% larger using the estimations employed. The ill-defined regions and consequently the analyses of homojunction designs that have been previously employed obscure this possibility [7].

While the band diagrams of FIGS. 3A and 3B have been utilized in the first example, the grading from one semiconductor material to another at the borders in this second example is now interpreted as being more gradual. In this example, the transition distance Δ over which the semiconductor properties change is ≤$L_{32}$/0.

There are a multitude of semiconductors that can be used with this boarder gradual transition approach, especially when interface engineering concepts are used to create the boundaries. [6].

CITED REFERENCES

[1] R. Strandberg, Theoretical efficiency limits for thermoradiative energy conversion, J. Appl. Phys. 117, 055105 (2015).
[2] Raman, A. P., Li, W. & Fan, S. Generating light from darkness. Joule 3, 2679-2686 (2019).
[3] T. Deppe, J. Munday. Nighttime photovoltaic cells: electrical power generation by optically coupling with deep space, AACS Photonics, 7, 1 (2020)
[4] Assawaworrarit, S., Omair, Z. & Fan, S. Nighttime electric power generation at a density of 50 mW/m2 via radiative cooling of a photovoltaic cell. Appl. Phys. Lett. 120, 143901 (2022).
[5] Omair, Z., Assawaworrarit, S., Fan, L., Jin, W. & Fan, S. Radiative-cooling-based nighttime electricity generation with power density exceeding 100 mW/m2. iScience 25, 104858 (2022).
[6] Fonash, S., Photovoltaic device physics and materials, 3rd edition, Elsevier (2025)
[7] Nielsen, Michael, Pusch, Andreas, Pearce, Phebe, Sazzad, Muhammad, Reece, Peter, Greeen, Martin, Ekins-Daukes, Nicholas, Semiconductor thermoradiative power conversion, Nature Photonics 18, 1137-1146, (2024)
[8] Fonash, S., Applied Physics Letters, Heterojunction Architecture for Increasing the Performance of Thermoradiative Electric Power Producing Devices, in submission to APPLIED PHYSICS LETT.

While at least two exemplary embodiment has been presented in the foregoing detailed descriptions, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

The invention claimed is:

1. A semiconductor heterojunction thermoradiative electric power generator comprising:

at least three semiconductor regions each with a different type of doping and each with a different degree of doping, wherein there is a first region which is n-doped, an intermediate electron-hole recombination, photon radiating, smallest band gap region, which is not purposefully doped, and a third region which is p-doped;

wherein each of said at least three semiconductors has at least one different band edge value and a different Seebeck coefficient; and a heat source in conductive contact with the first region and the third region, creating a temperature difference between said heat source and the recombination-radiating region.

2. The semiconductor heterojunction thermoradiative electric power generator of claim 1 wherein the semiconductor heterojunction thermoradiative electric power generator is configured to convert heat per second in a source or a storage volume into electrical current-voltage power.

3. The semiconductor heterojunction thermoradiative electric power generator of claim 1 wherein a conduction band edge energy level has a transition to a higher energy value.

4. The semiconductor heterojunction thermoradiative electric power generator of claim 1 wherein the conduction band edge transition to a higher energy value occurs at border location 3 and is sufficient to block further electron transport into the third region with the p-doping of the semiconductor heterojunction thermoradiative electric power generator.

5. The semiconductor heterojunction thermoradiative electric power generator of claim 1 having a valence band edge energy level transition to a lower energy value at border 2 sufficient to block hole motion into the first region with the n-doping.

6. The semiconductor heterojunction thermoradiative electric power generator of claim 1 wherein two of the at least three semiconductors are formed of materials having advantageous Seebeck coefficient values which advantageously impact the Thompson voltage.

7. The semiconductor heterojunction thermoradiative electric power generator of claim 1 wherein at least two of the three semiconductors are formed of materials having a reduction of resistance loss.

* * * * *